United States Patent [19]
Brown

[11] Patent Number: 5,581,253
[45] Date of Patent: Dec. 3, 1996

[54] IMPLEMENTATION AND METHOD FOR A DIGITAL SIGMA-DELTA MODULATOR

[75] Inventor: Glen W. Brown, Austin, Tex.

[73] Assignee: Advanced Micro Devices, Austin, Tex.

[21] Appl. No.: 510,139

[22] Filed: Aug. 3, 1995

[51] Int. Cl.$^6$ ........................................... H03M 3/00
[52] U.S. Cl. .................................... 341/144; 341/143
[58] Field of Search ................................ 341/143, 141, 341/76, 77; 345/247

[56] References Cited

U.S. PATENT DOCUMENTS 5,144,308  9/1992  Norsworthy .......................... 341/131
5,196,850  3/1993  Duffy et al. .......................... 341/76
5,414,424  5/1995  Cabler .................................... 341/143

Primary Examiner—Jeffrey A. Gaffin
Assistant Examiner—Peguy JeanPierre
Attorney, Agent, or Firm—Fulbright & Jaworski L.L.P.

[57] ABSTRACT

Described herein is a digital sigma-delta modulator and method for converting a multi-bit digital input signal to a 1-bit digital output signal. The digital sigma-delta modulator performs a noise shaping filter function for a digital-to-analog circuit. A series of cascaded integration stages are implemented with a plurality of multiplexed adders which perform the integration functions.

25 Claims, 2 Drawing Sheets

IMPLEMENTATION AND METHOD FOR A DIGITAL SIGMA-DELTA MODULATOR

BACKGROUND OF THE INVENTION

1. Field of the Invention

This invention relates to a digital implementation of a sigma-delta modulator. More particularly, this invention relates to a sigma-delta modulator used as a portion of a digital-to-analog conversion (DAC) circuit, where the modulator converts a multi-bit digital input signal to a 1-bit digital output signal.

2. Brief Description of the Related Technology

Sigma-delta modulators are preferred in DAC circuits because of their inherent feasibility to be manufactured in integrated circuits. These sigma-delta modulators typically convert a multi-bit input signal to a 1-bit output signal. This quantization, if performed by merely truncating or rounding the multi-bit input signal, would introduce a large amount of noise in the signal passband, thereby destroying the signal quality. Additionally, the sigma-delta modulator for the DAC circuit must filter out of band noise from the signal being converted, via a noise transfer function for the modulator, and must manipulate the signal being converted, according to a predetermined signal transfer function.

A digital sigma-delta modulator system design for shaping noise in a DAC circuit is described in application Ser. No. 08/333,386, filed Nov. 2, 1994, entitled "Digital Noise Shaper For D/A Circuit", assigned to the common assignee of the present invention.

SUMMARY OF INVENTION

The present invention is for a digital sigma-delta modulator for a DAC circuit which filters out-of-band noise from the signal being converted by way of a noise transfer function. The digital sigma-delta modulator of the present invention also operates on the signal being converted according to a predetermined signal transfer function for the modulator. The present digital sigma-delta modulator converts a multi-bit digital input signal to a one-bit digital output signal.

The modulator of the present invention receives an oversampled multi-bit input signal, having a high signal to noise ratio (SNR), from a digital interpolation circuit. The modulator modulates the input signal down to a reduced bit width for input to a digital to analog conversion circuit. The modulator includes a quantizer to truncate the signal to the desired length, and feedback to perform the desired transfer function to maintain the SNR while shaping the noise introduced by the quantization by moving it above the signal band using digital filtering.

DETAILED DESCRIPTION OF THE PREFERRED EMBODIMENT

Figure 1:
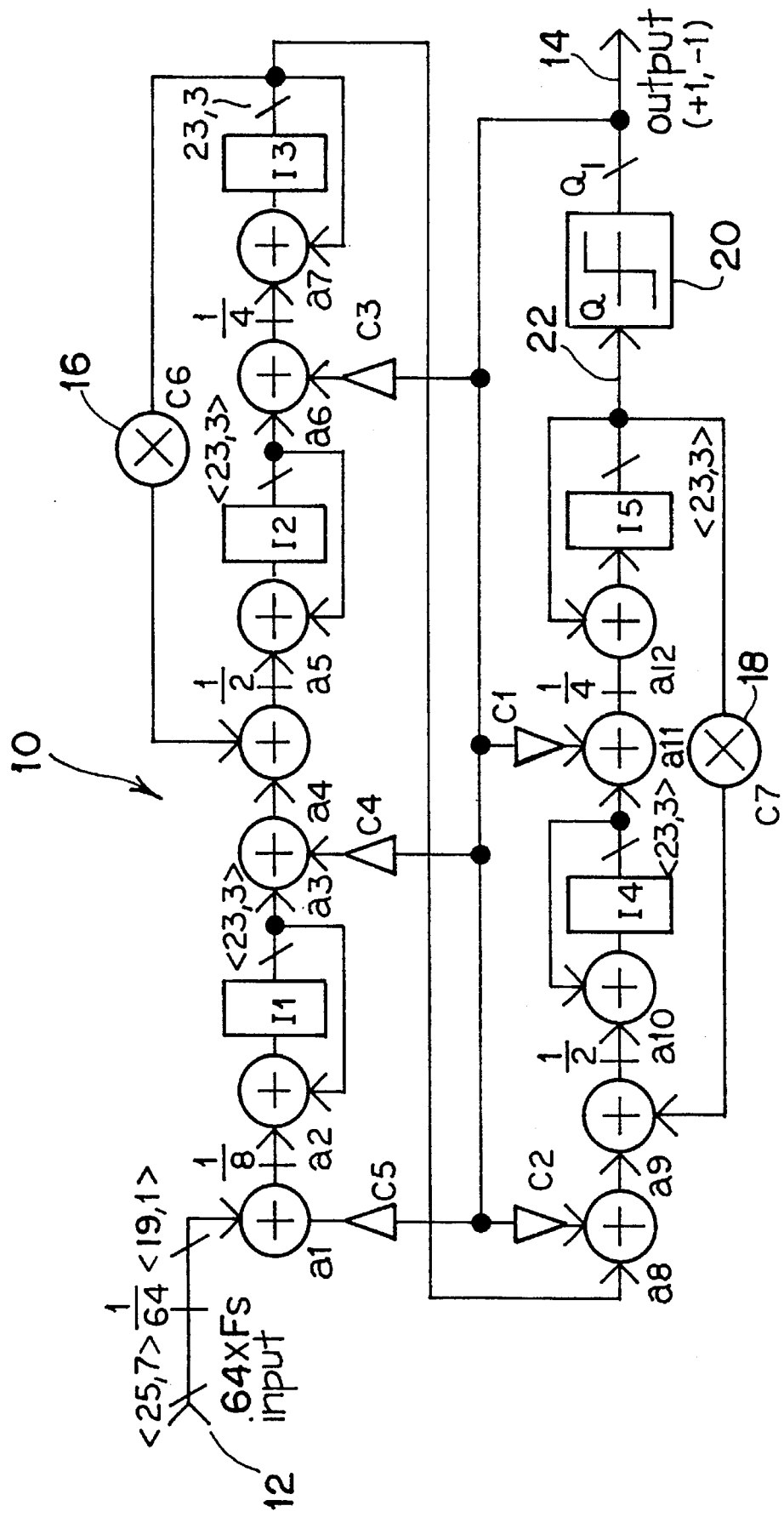
FIG. 1 is a functional block diagram of the sigma-delta modulator of the present invention.

Referring to FIG. 1, the noise shaper filter block 10 performs a sigma-delta conversion to convert a multi-bit digital input signal 12, preferably 25 bits wide and at a frequency of $64 \times F_s$, to a 1-bit digital output signal 14. This quantization to a 1-bit output signal introduces noise in the signal, which is shaped according to a high pass signal transfer function given by:

$$H_X(z) \equiv H_{NS5}(z) = \frac{Y(z)}{X(z)} = \frac{1}{D},$$

where $$D = (1 - Z^{-1})^5 + \sum_{k=1}^{5} W_k * Z^{-k}(1 - Z^{-1})^{5-k}$$

where $W_k$ is given by:

| | | |
|---|---|---|
| $W_1 = -C_1 K_1$ | with | $K_1 = 0.25$ |
| $W_2 = C_2 K_2 - C_6 \left( \frac{C_4}{C_2} \right) - C_7 K_2$ | | $K_2 = 0.5$ |
| $W_3 = -C_3 K_3 + C_1 K_1 \left( \frac{K_1 K_4}{K_2} \right)$ | | $K_3 = 0.25$ |
| $W_4 = -C_4 K_4 + C_2 C_6 K_4 + C_6 C_7 K_4$ | | $K_4 = 0.5$ |
| $W_5 = -C_5 K_5$ | | $K_5 = 0.125$ |

The noise shaper filter 10 has a noise transfer function given by:

$$H_X(Z) = \frac{Y(Z)}{E(Z)} = \frac{1}{D} \left[ (1 - Z^{-1})^5 - 2 C_1 Z^{-2}(1 - Z^{-1})^3 + C_2 Z^{-4}(1 - Z^{-1}) \right]$$

where $E(Z)$ is the digital noise input signal. The coefficients $C_1, C_2, C_3, C_4, C_5$ are given in Table 1.

Figure 2:
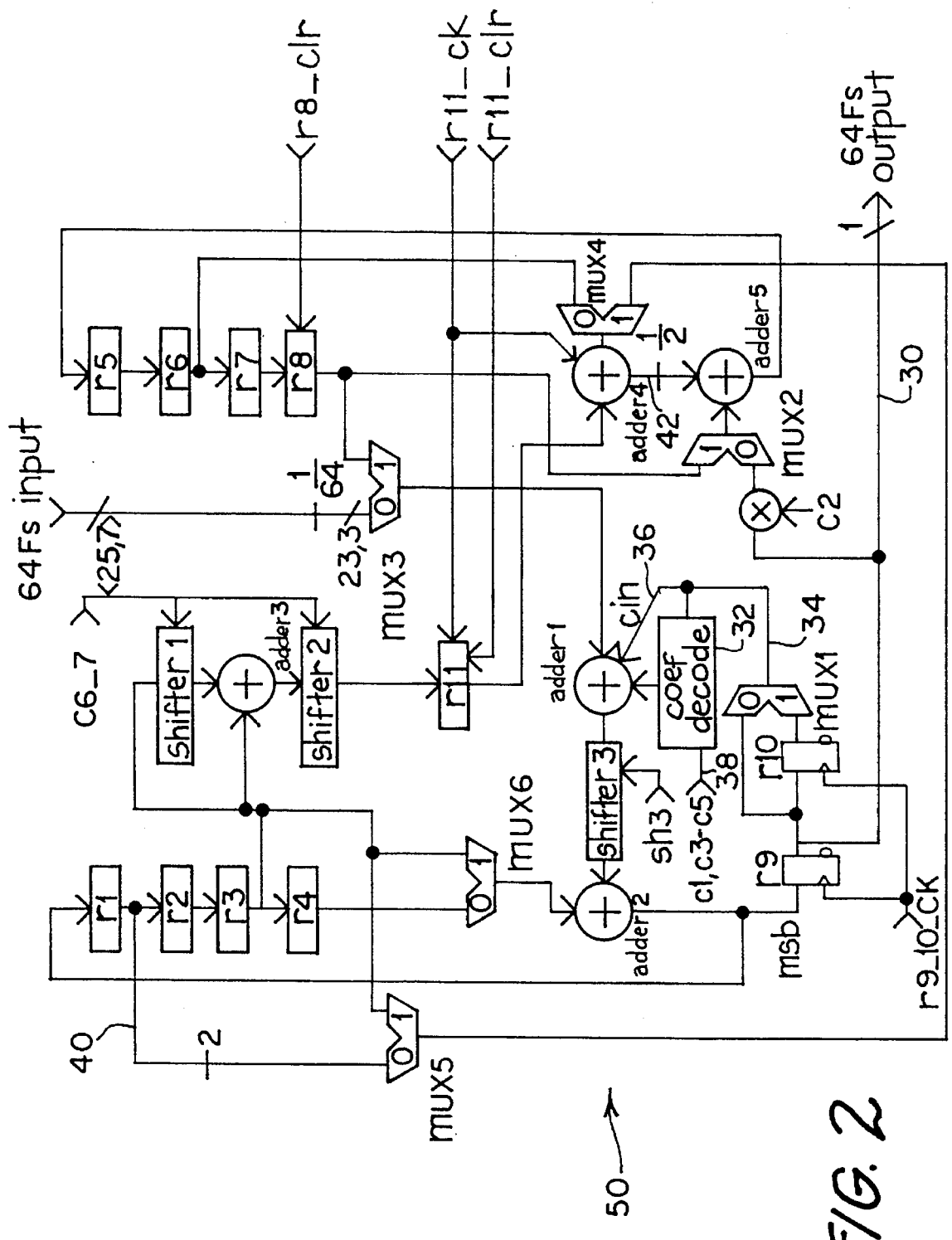
FIG. 2 is a schematic illustration of the sigma-delta modulator of the present invention.

The noise shaper block 10, shown in FIG. 1, includes a total of twelve 23-bit addition operations, two multiplication operations, and five scaling operations in between the five integration stages $I_1$-$I_5$. The twelve addition operations are performed by adders a1–a12. The two multiplication operations are performed by multipliers 16 and 18. The five scaling operations are indicated by the fractional factors identified in FIG. 1 (i.e. ⅛, ½, ¼, ½ and ¼). Scaling is performed by a bit shifting operation. The clock signal used to control the data path implementing noise shaper block of FIG. 2, 10 is set to a rate of 256 times the sample frequency ($256 F_s$). The coefficients $C_1$-$C_5$, which implement the poles for the above-mentioned transfer functions, have been quantized to 10 bits without adversely effecting the transfer function in the signal band. The noise shaper block 10 implementation has coefficients $C_1$-$C_5$ which are multiplied by the quantized output 14 of quantizer 20, which has a value of either +1 or −1. The coefficients $C_6$ and $C_7$, implementing the transfer function zeroes, have been reduced to two terms, each teton being a power of two. The values for coefficients $C_{1-7}$ are shown in Table 1.

TABLE 1

| NOISE SHAPER BLOCK COEFFICIENTS | |
|---|---|
| $C_1 = -4.703125$ | |
| $C_2 = -4.71875$ | |
| $C_3 = -5.59375$ | |
| $C_4 = -1.875$ | |
| $C_5 = -1.296875$ | |
| $C_6 = -.02734375$ | $= -\frac{1}{32}(1-\frac{1}{8})$ |
| $C_7 = -.009765625$ | $= -\frac{1}{128}(1+\frac{1}{4})$ |

The noise shaper block 10 output signal 14 occurs once every four 256 $F_s$ clock cycles, or at a rate of 64 times the sample frequency (64 $F_s$). The data input and output rates are at 64 $F_s$. The fixed bit width through noise shaper block 10, with data normalized in a prior interpolation filter, is 23 bits, where 3 bits are integer and 19 are fractional. An implementation of noise shaper block 10 in FIG. 1 which utilizes fewer adders to save hardware and increase efficiency is illustrated schematically in FIG. 2. The embodiment of the digital sigma-delta modulator, noise shaper circuit 50, as shown in FIG. 2, is an implementation of the functional sigma-delta modulator noise shaper block 10, illustrated in FIG. 1, with the amount of hardware minimized to reduce the number of adders required. Thus, the embodiment shown in FIG. 2 utilizes the adders illustrated therein such that the five stages of integration shown in FIG. 1 are performed by the embodiment shown in FIG. 2, using a lesser number of adders, by multiplexing the adders in FIG. 2 so each multiplexed adder in FIG. 2 may perform more than one integration stage operation per single-bit output. In FIG. 1, each adder associated with each of the five integration stages performs only one operation per output. Thus, the embodiment shown in FIG. 2 is a much more efficient and less expensive design.

The multiplexers in FIG. 2 which control certain adders, (i.e. mux 3 which controls adder 1, mux 4 which controls adder 4, mux 6 which controls adder 2, mux 2 which controls adder 5 and mux i which controls adder 1) are selecting devices which may be implemented by the multiplexers shown in FIG. 2, or by any other device which selects a digital output signal from among a plurality of digital input signals.

The scaling factors illustrated in FIG. 1 after adders a1, a4, a6, a9, and a11, which are powers of two, are implemented in bit shift operations. In FIG. 1, the addition operations of adder a6, the scaling operation of ¼ between adders a6 and a7, and the addition operation of adder a7 are performed by adder1 and adder2 along with shifter3 in FIG. 2. The input sh3 to shifter3 in FIG. 2, which is generated in a control circuit, not shown, shifts the output of adder1 by $2^{-2}$ or $2^{-3}$, as needed during the calculations.

In FIG. 1, the two addition operations performed on adders a11 and a12 with a scaling of ¼ in-between are performed by adder1 and adder2 in the FIG. 2 embodiment during a first clock cycle. In FIG. 1, the addition operations of adder a4, the scaling of ½ between adders a4 and a5, and the addition operation of adder a5 are performed by adder4 and adder5 in FIG. 2, along with the fixed shift of $2^{-2}$ after adder4 in FIG. 2. In FIG. 1, the two addition operations, performed on adders a9 and a10, along with a scaling of ½, are performed by adder4 and adder5 in the FIG. 2 embodiment during a different clock cycle. That is, a different clock cycle than the operations of a4 and a5 of FIG. 1, which as previously described, are also performed on adder4 and adder5 of FIG. 2.

In FIG. 1, the addition operation of adder a1, the scaling of ⅛ between adders a1 and a2, and the addition operation of adder a2 are performed by adder 1 and adder2 and shifter3 in FIG. 2. The control input sh3 causes shifter3 to multiply the output of adder1 by $2^3$. In FIG. 1, the addition performed by adder a3 is accomplished as illustrated in FIG. 2 by the "1" input of mux3 being held equal to zero by mux3_sel being set equal to 1 and by register r8 being cleared. In FIG. 1, the addition operation performed by adder a8 is performed by adder4 and adder5 in FIG. 2. Since the calculation performed by adder a8 in FIG. 1 is the sum of two terms, one input to adder4 in FIG. 2 is held equal to zero by register r11 being cleared using input r11_clr and by adding the output of adder4 to the output from mux2 in adder5.

The feedback coefficients $C_6$ and $C_7$ in FIG. 1 are performed by shifter1, adder3, and shifter2 in FIG. 2. These two feedback coefficients are quantized to a shifted sum of two terms as shown in Table 1. A sequence of four 64 Fs clocks are used to generate the output of noise shaper circuit 50. At different clock cycles during the sequence, the value in integrators $I_3$ and $I_5$ of FIG. 1, are provided to register r3 of FIG. 2. The input c6_7 is used to cause shifter1 to shift the data in register r3 by a factor of $2^{-3}$ or by $2^{-2}$ as needed for implementing C6 and C7, respectively. Registers r1-r8 in FIG. 2 are used to hold the values of the integration stages $I_1$, $I_2$, $I_3$, $I_4$, and $I_5$ in FIG. 1 along with the output of adders a3 and a9. The values are clocked continuously at 256 $F_s$ through the eight registers in FIG. 2 to make the data available to the adders at the proper time.

The feedback terms implementing the zeroes of the transfer equation are created by multiplying the output of integrator $I_3$, in FIG. 1 by coefficient $C_6$ and adding the product to the input of integrator $I_2$. Similarly, the output of integrator $I_5$ is "multiplied" by coefficient C7 and added into the input of integrator $I_4$. At different clock cycles during the sequence of four 64 $F_s$ clocks, the output of integrators $I_3$ and $I_5$ of FIG. 1 are provided to register r3 of FIG. 2. The multiplication of feedback filter coefficient C6 by the output of integrator $I_3$ as well as the multiplication of feedback filter coefficient C7 by the output of integrator $I_5$ is accomplished using shifter1 and shifter2 in FIG. 2. The control input C6_7 is used to control shifters 1 and 2 to implement coefficient C6 and C7 at the appropriate time. Shifter 1 is switched between a scaling factor operation of $-2^{-3}$ and $2^{-2}$ for C6 and C7, respectively. Shifter 2 is switched between a scaling factor operation of $2^{-5}$ and $2^{-7}$ for C6 and C7, respectively. The product of C6 and integrator $I_3$ is held in register r11, in FIG. 2, and then used by adder4. Then, the product of C7 and integrator $I_5$ is held in register r11.

The sequence of four clock cycles and operations performed therein, wherein each clock cycle is at a rate of 64 $F_s$, is provided in Table 2.

TABLE 2

Order of Calculations of FIG. 1

CYCLE CALCULATION PERFORMED ON FIG. 1

0  output of a3 = $I_1(n) + Q(n) * C_4$
    output of a8 = $I_3(n) + Q(n) * C_2$
1  $I_1(n+1) = [I_{in}(n) + Q(n) * C_5]$ ⅛ + $I_1(n)$
    feedback into a9 = $I_5(n) * C_7$
2  $I_5(n+1) = [I4(n) + Q(n)*C_1]$ ¼ + $I_5(n)$
    $I_4(n+1)$ = [feedback into a9) + (output of a8)] ½ + $I_4(n)$
    feedback into a4 = $I_3(n) * C_6$
    where (feedback into a9) and (output of a8) were calculated above
3  $I_3(n+1)=[I_2(n) + Q(n)*C_3]$ ¼ + $I_3(n)$
    $I_2(n+1)=[$(output of a3)+(feedback into a4)] ½ + $I_2(n)$ where (output of a3) and (feedback into a4) were calculated above.

In the prior art, U.S. Pat. No. 5,196,850 for a "Fourth Order Digital Delta-Sigma Modulator", assigned to Crystal Semiconductor of Austin, Tex., describes the use of a single adder with a bank of serially connected registers, typically four, to implement a sigma-delta modulator comprised of a series of cascaded integrators. As disclosed therein, the output of the integrators must be summed to form the output of the digital sigma delta. In the present invention, the digital sigma-delta modulator, which utilizes the architecture shown in FIG. 1, uses two sets of adders where each set is comprised of two adders to implement the calculations for the integrator stages, five in the preferred embodiment, as well as the summation of the quantized output multiplied by the coefficients and the output of the integrator stages. The calculations for calculating the 1-bit output are shown in Table 2. The calculations shown by the circuit of FIG. 1 have been allocated to one of the four clock cycles available to calculate each output value. In Table 2, n represents the current sequence of four clock cycles which generate one quantized output 14 shown in FIG. 1. $Q_{(n)}$ is the 1-bit quantized output signal 14 representing the polarity of the output 22 of integrator $I_5$ during sequence n. Ix represents the value for each of the five integrators $I_1$- $I_5$ of FIG. 1, where x=1–5.

Describing the Operations of Table 2 For Each Clock Cycle

In cycle 0, two intermediate values are calculated with the output of adders a3 and a9, in FIG. 1. The output of adder a3 is the sum of the current interpolator $I_1$ output and the coefficient C4 "multiplied" by the 1-bit quantized output 14. The output of a3 is stored. The output of adder a8 is the sum of the current interpolator $I_3$ output and the coefficient C2 "multiplied" by output 14. The output of a8 is stored.

In cycle 1, the new value of interpolator $I_1$ is calculated. The sum of output 14 "multiplied" by coefficient C5 and the scaled input 12 is then scaled by ⅛. This sum is added to the previous value of interpolator $I_1$. This new value of $I_1$ is stored. Also, the product of interpolator $I_5$ and coefficient C7 is stored.

In cycle 2, the new value of interpolator $I_5$ is calculated. The output 14 is "multiplied" by coefficient C1 and added to the previous value of interpolator $I_4$. This sum is then scaled by ¼ and added to the previous value of interpolator $I_5$. This new value of I5 is stored. Also in cycle 2, the new value of interpolator $I_4$ is calculated. The output of adder a8 previously stored in cycle 0 is added to the product of output 14 and coefficient C7 previously stored in cycle 1. This sum is then scaled by ½ and added to the previous value of interpolator $I_4$. This new value of $I_4$ is stored. Also in cycle 2, the product of interpolator $I_3$ and coefficient C6 is stored.

In cycle 3, the new value of interpolator $I_3$ is calculated. The output 14 is "multiplied" by coefficient C3 and added to the previous value of interpolator $I_2$. This sum is then scaled by ¼ and added to the previous value of interpolator $I_3$. This new value of $I_3$ is stored. Also in cycle 3, the new output of interpolator $I_2$ is calculated. First, the output of adder a3, previously stored in cycle 0, is added to the product of interpolator $I_3$ and coefficient C6. This sum is scaled by ½ and added to the previous value of integrator $I_2$. This new value of integrator 12 is stored. This sequence of four cycles is repeated.

The calculations made in each of the four clock cycles of the sequence of operation by noise shaper circuit 50 of FIG. 2 are shown in Table 3. Table 3 depicts the data transfers made on each clock cycle for noise shaper circuit 50. Control signals, utilized by noise shaper circuit 50 are generated external to FIG. 2 include: multiplexer control signals, an input to toggle shifters 1 and 2 to select between coefficient inputs $C_6$ and $C_7$, an input to shifters 1 and 2, an input to shifter 3, and clear signals for registers r11 and r8. Shifter 3 is used to implement the scaling factor of ⅛ prior to integrator 1 (I1) and the scaling factor of ¼ prior to I3 and I5, in FIG. 1. To scale by a factor of ¼, shifter 3 shifts the multi-bit digital signal by two bit places. To shift by a factor of ⅛, shifter 3 shifts the bit stream by three bit places. Registers r1–r8 are clocked continuously with the 256 $F_s$ clock. The quantized output bit signal 30 in FIG. 2 takes on a value of one if the output signal 22 (FIG. 1) of $I_5$ is less than zero, and zero if $I_5$ output signal 22 is greater than or equal to zero. Thus, output bit signal 30 represents the sign of the quantized output signal 14 of the noise shaper block 10 of FIG. 1.

In FIG. 2, two groups of serially configured data registers are shown. Registers r5-r8 are one group of serially configured data registers used to store data values which represent the output of adder a8, the value of I2 and I4 of FIG. 1. The output of adder 5 is provided to the first data register in the serial configuration, r5. The last data register, r8 in that group of serially configured data registers is provided to mux 3 and mux 2 as an input. The other group of serially configured data registers includes registers r1-r4. This group of serially configured data registers is used to store data values for the output of adder a3, and the value of integrators I1, I3 and I5 of FIG. 1. The first data register in this group, r1, receives an input from the output of adder 2. The last data register in this group, r4 provides its output to mux 6 as an input. In each of the two groups of serially configured data registers described, there are two intermediate data registers. In the first group, these are r6 and r7. In the second group, these are r2 and r3. In the first group, the output of r6 is provided to mux 4 as an input. In the second group, the output of r3 is provided to mux 6 and mux 5 as an input and to shifter 1 and adder 3 as an input.

The coefficient decode (coef. decode) block 32, which is a RAM, ROM, or other memory storage device, in FIG. 2, receives a control signal 38 from an external control circuit, not shown, to select coefficients $C_1$, $C_3$, $C_4$, or $C_5$ for output from coef. decode block 32 to be input to adder 1. Coef. decode block 32 performs a one's complement on the selected coefficient to implement the multiplication of Cx * (−1) if the 1-bit output 14 in FIG. 1, or Q(n), equals 1. The Q(n) value in FIG. 1, is output from mux 1 output signal 34 as the output of register r9 or r10 in FIG. 2, depending on the clock cycle number. The purpose of mux 1 is to cause its output 34 to equal the quantized output, $Q_n$, of integrator 5. Since the new value of integrator 5 $I5_{n+1}$ is calculated while the current quantized output $Q_n$ is still needed, both are kept in registers r9 and r10. In FIG. 2, the input r9_10_ck from a control circuit latches the sign bit of adder2 during cycle 3 into register r9 as $Q_{n+1}$. During this same cycle, the current $Q_n$ in register r9 is latched into register r10.

As shown in Table 2, during clock cycles 0–2, the mux select control signal for mux 1 is set to zero, which allows the output of r9 to be provided as mux 1 output signal 34. During clock cycle 3, the mux select control signal for mux 1 is set to 1, which causes the output of r10 to be provided as mux 1 output signal 34. Mux 1 output signal 34 is used as the carry-in (cin) 36 to adder 1 to complete the two's complement for the selected coefficient $C_1$, $C_2$, $C_3$ or $C_5$.

Many operations in Table 3 are performed to allow the common hardware implemented in the noise shaper circuit 50 of FIG. 2 to perform the integration, multiplication and addition functions of the noise shaper block 10 of FIG. 1. For example, in cycle 0 of Table 3, coefficient $C_4$ from FIG. 1 is prescaled by a multiplication by 4 and then stored as $C_4$ * 4 in FIG. 2 and then scaled by ¼ by shifter 3 in FIG. 2. This operation is performed to reduce the number of shifts needed by shifter 3 to two so shifter 3 can scale the signal by a factor of ¼ or ⅛ depending on whether integration stage $I_1$, $I_3$ or $I_5$ from FIG. 1 is being performed by the implementation in FIG. 2, as previously discussed. Also, in cycle 0, the value in register r1 is multiplied by a factor of two prior to the r1 output signal 40 entering mux 5, to compensate for a fixed multiplication factor of ½ performed on the adder a4 output signal 42. In this manner, all five stages of integration ($I_1$-$I_5$)

shown in FIG. 1 are accomplished by the hardware implementation shown in FIG. 2.

In cycle 0, the output of FIG. 2 adder2 and adder5 are the output of FIG. 1. adder a3 and adder a8, respectively. The sum of FIG. 2. adder2 results from the input c4 selecting coefficient C4*4 from the coef decode block 32. The coefficient C4 is stored as C4*4 to allow for a common factor of ¼, implemented by shifter 3, with other calculations. The output of mux 3 is zero from register r8, which is cleared with r8__clr. The output of adder1 is equal to $Q_n$*C4*4. Input sh3=0 causes shifter 3 to shift this value by 2 for a factor of ¼ resulting in Qn*C4. The output of integrator 1 I1 of FIG. 1 is in register r3. The input mux6__sel=1 and the output of FIG. 2 adder2 is the output of a3 of FIG. 1, which is equal to $I1_n$*C4*$Q_n$. This value is then stored in register r1. Also during cycle 0 the sum of FIG. 2 adder5 results from the mux5__sel=0, mux4__sel=1, r11__clr=1 which causes the output of FIG. 2 adder4 to equal the value in register r1 which is currently the output of integrator 1 $I3_n$ in FIG. 1. The output of adder4 is reduced by ½ and added to $Q_n$*C2 from mux2__sel=0. The output of FIG. 2 adder5 is the output of FIG. 1 a8. This value is then stored in register r5.

In cycle 1, the output of FIG. 2 adder2 is the new output of FIG. 1 integrator 1 $I1_{n+1}$. The input c5 and mux1__sel=0 selects the coef decode block 32 to output coefficient C5 or −C5 depending on $Q_n$ 34 where it is added to the input value. The input sh3=1 causes shifter 3 to shift the output of adder1 by 3 for a factor of ⅛. The input mux6__sel=0. The output of shifter 3 is added to register r4, which contains the current output of FIG. 1 integrator 1 $I1_n$. The output of FIG. 2 adder2 is the new output of FIG. 1 integrator 1 $I1_{n+1}$. This value is then stored in register r1. Also in cycle 1, the output of FIG. 2 shifter2 is the feedback into FIG. 1 a9 from integrator 5 $I5_n$. The input C6_7=1 which causes the value $I5_n$ currently in FIG. 2 register r3 to be multiplied by coefficient C7 using the terms shown in Table 1. The one's compliment of C7*$I5_n$ is stored in register r11. When this term is used in cycle 2, the two's compliment is obtained by using the input signal r11__ck as the carry in to adder4 of FIG. 2. In cycle 1, the output of FIG. 2 adder5 is not used.

In cycle 2, the output of FIG. 2 adder2 is the new output of FIG. 1 integrator 5 $I5_{n+1}$. The input C1, and mux3__sel=1 and mux1__sel=0, selects the coef decode block 32 to output coefficient C1 or −C1 depending on $Q_n$ 34 where it is added to the value of FIG. 1 integrator 4 $I4_n$ located in FIG. 2 register r8. The input sh3=0 causes shifter 3 to shift the output of adder1 by 2 for a factor of ¼. The input mux6__sel=0. The output of shifter 3 is added to register r4, which contains the current output of FIG. 1 integrator 5 $I5_n$. The output of FIG. 2 adder2 is the new output of FIG. 1 integrator 5 $I5_{n+1}$. This value is then stored in register r1. Also in cycle 2, the output of FIG. 2 adder5 is the new output of FIG. 1 integrator 4 $I4_{n+1}$. The inputs mux4__sel=0, from r6, and mux2__sel=1, from r8, select the previously stored FIG. 1 adder a8 output from FIG. 2 register r6 to be added to the previously stored feedback into FIG. 1 a9 from FIG. 2 register r11. The output of adder4 is shifted by 1 for a factor of ½ and added to FIG. 1 integrator 4 $I4_n$ located in FIG. 2 register r8. This new value of FIG. 1 integrator 4 $I4_{n+1}$ is then stored in register r5.

Also during cycle 2, the input C6_7=0 causes the FIG. 1 integrator 3 value $I3_n$ currently in FIG. 2 register r3 to be multiplied by coefficient C6 using the terms shown in Table 1. The one's compliment of C6*$I3_n$ is stored in register r11. When this term is used in cycle 3, the two's compliment is obtained by using the input signal r11__ck as the carry in to adder4 of FIG. 2. Since a new FIG. 1 integrator 5 $I5_{n+1}$ output is calculated, on the next cycle the input r9__10__ck transitions from 0 to 1 to clock the value $Q_n$ into register r10 and $Q_{n+1}$, into register r9.

In cycle 3, the output of FIG. 2 adder2 is the new output of FIG. 1 integrator 3 $I3_{n+1}$. The input c3 and mux1__sel=1 selects the coef decode block 32 to output coefficient C3 or −C3 depending on $Q_n$ 34 where it is added to the value of FIG. 1 integrator 2 $I2_n$ located in FIG. 2 register r8. The input sh3=0 causes shifter 3 to shift the output of adder1 by 2 for a factor of ¼. The input mux6__sel=0. The output of shifter 3 is added to register r4, which contains the current output of FIG. 1 integrator 3 $I3_n$. The output of FIG. 2 adder2 is the new output of FIG. 1 integrator 3 $I3_{n+1}$. This value is then stored in register r1.

Also in cycle 3, the output of FIG. 2 adder5 is the new output of FIG. 1 integrator 2 $I2_{n+1}$. The inputs mux4__sel=1, mux5__sel=1, mux2__sel=1 select the previously stored FIG. 1 adder a3 output from FIG. 2 register r3 to be added to the previously stored feedback into FIG. 1 a4 from FIG. 2 register r11. The output of adder4 is shifted by 1 for a factor of ½ and added to FIG. 1 integrator 2 $I2_n$ located in FIG. 2 register r8. This new value of FIG. 1 integrator 2 $I2_{n+1}$ is then stored in register r5.

TABLE 3

| | | Sequence of operation of FIG. 2 | |
|---|---|---|---|
| cycle | Control Signals | Calculations performed on FIG. 2 | Calculations of Table 1 |
| 0 | mux__sel 1,2,5 =0<br>mux__sel 3,4,6 =1<br>sh3 = 0;(shifter3= ¼)<br>r8__clr=1, r11__clr = 1<br>c6_7 = 1 | sum1=[r9*(C4*4)]<br>where r9=Q(n)<br>shifter 3 output = sum1 * ¼<br>sum2=[sum1 + r3]<br>where r3=$I_1$(n)<br>sum4=[r1*2]<br>where r1=$I_3$(n)<br>sum5=[sum4*½ + r9*C2]<br>where r9=Q(n) | <br><br><br>output of a3<br><br><br><br>output of a8 |
| 1 | mux__sel 1,3,5,6 =0<br>mux__sel 2,4 = x<br>c5 = 1<br>sh3 = 1; shifter3=⅛<br><br><br><br>c6_7 = 1 | sum1=[input + r9 C5]<br>where input =64Fs input data<br>where r9 = Q(n)<br>shifter 3 output = sum1 * ⅛<br>sum2=[sum1]⅛ + r4<br>where r4=I1(n)<br>sum4,5 = x<br>shifter 2 output=(r3 * $C_7$) − 1 | $I_{in}$(n) $Q_n$* $C_5$<br><br><br>($I_{in}$(n) + $Q_n$* $C_5$)*⅛<br>$I_1$(n+1)<br><br><br>feedback into a9−1 |

TABLE 3-continued

Sequence of operation of FIG. 2

| cycle | Control Signals | Calculations performed on FIG. 2 | Calculations of Table 1 |
|---|---|---|---|
| 2 | clock r11 | where r3=I5(n) | |
| | mux_sel 1,4,6 = 0 | reg11 = shifter 2 output | store − (I$_5$(n)*C7) − 1 |
| | mux_sel 5 = x | sum1=[r9 * C1 + r8] | I$_4$(n) + Q$_n$* C$_1$ |
| | mux_sel 2,3 = 1 | where r9=Q(n) | |
| | sh3 = 0; shifter 3 = ¼ | where r8=I4(n) | |
| | c1 = 1 | shifter 3 = sum1 * ¼ | (I$_4$(n) + Q$_n$* C$_1$)*¼ |
| | | sum2=[sum1]¼ + r4 | I$_5$(n+1) |
| | | where r4=I5(n) | |
| | | sum4=[r11 + r6]+ 1 | feedback into a 9+output of a8 |
| | | where r11=feedback into a9 − 1 | |
| | | where r6= output of a8 | |
| | | sum5=[sum4]½ + r8 | I$_4$(n+1) |
| | | where r8=I4(n) | |
| | c6_7 = 0 | shifter2 output = −(r3 * C$_6$) − 1 | feedback into a4 − 1 |
| | | where r3=I3(n) | |
| 3 | clock reg9 | reg9 = Q(n+1) | store next quantized output |
| | clock reg10 | reg10 = Q(n) | save current Q(n) |
| | clock r11 | reg11 = I$_3$(n) * C6 | |
| | mux_sel 6=0 | sum1=[r8 + r10 * C3] | I$_2$(n) + Q$_n$* C$_3$ |
| | mux_sel 1,2,3,4,5=1 | where r8=I2(n) | |
| | c3 = 1 | where r10=Q(n) | |
| | sh3=0; shifter 3=¼ | shifter3 output = sum1 * ¼ | |
| | c6_7 = 0 | sum2=[sum1]¼ + r4 | I$_3$(n+1) |
| | | where r4=I3(n) | |
| | | sum4=[r11 + r3] +1 | feedback into a4 + output of a3 |
| | | where r11=feedback into a4 − 1 | |
| | | where r3=output of a3 | |
| | | sum5=[sum4]½ + r8 | I$_2$(n+1) |
| | | where r8=I2(n) | |

As can be observed from a close reading of Table 3, each operation in noise shaper block 10 of FIG. 1 is implemented by the calculations in Table 3.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A sigma-delta modulator for a digital-to-analog converter (DAC) circuit, comprising:

(a) a multi-bit digital input signal;

(b) a first multiplexer, having a plurality of inputs and an output, wherein said digital input signal is connected to one of said inputs of said first multiplexer;

(c) first adder, having a plurality of inputs and an output, wherein said first multiplexer output is connected to one of said plurality of first adder inputs;

(d) a coefficient decode circuit having an input, and having an output connected to another input of said first adder;

(e) a shift register, having an input and an output, wherein said output of said first adder is connected to said shift register input;

(f) a second adder, having a plurality of inputs and an output, wherein said shift register output is connected to one of said plurality of second adder inputs; and wherein said output of said second adder is provided to a quantizer for output as a 1-bit digital output signal.

2. A digital sigma-delta modulator for converting a multi-bit digital input signal to a 1-bit digital output signal, comprising:

(a) a first device for selecting between said digital input signal and a signal output from a first serial configuration of data registers, wherein said selected signal is provided to a first adder;

(b) a feedback signal and a selected coefficient value being provided to said first adder to be summed with said selected signal;

(c) an output of said first adder being scaled before being provided to a second adder; and (d) a second selecting device which selects between one of two signals output from a second serial configuration of data registers, wherein said selected one of two signals is provided to said second adder to be summed with said scaled first adder output signal;

wherein a 1-bit digital output signal is output from said second adder.

3. The modulator of claim 2, wherein said second adder output is provided to a quantizer.

4. The modulator of claim 3, wherein said quantizer comprises a flip-flop.

5. An oversampling digital sigma-delta modulator for a digital-to-analog converter circuit, comprising:

(a) a multi-bit digital input signal;

(b) a first group of serially connected data registers;

(c) a second group of serially connected data registers;

(d) a first multiplexer which selects between said multi-bit digital input signal and an output signal from a last register in said first group of serially connected data registers, wherein said signal selected by said first multiplexer is provided to an input of a first adder; and (e) a second multiplexer which selects between an output signal from a last register in said second group of serially connected data registers and an output signal from an intermediate register within said second group of serially connected data registers, wherein said signal selected by said second multiplexer is provided to an input of a second adder;

wherein an output of said first adder is scaled and then provided to another input of said second adder; and wherein an output of said second adder is provided to a quantizer for output as a 1-bit digital output signal.

6. The sigma-delta modulator of claim 5, wherein said quantizer comprises a flip-flop.

7. The sigma-delta modulator of claim 5, further comprising a coefficient decode circuit, having an input selectively connected to a first or a second data register, and having an output connected to another input of said first adder.

8. The sigma-delta modulator of claim 5, wherein said output of said second adder is also provided to a first register in said second group of serially connected data registers.

9. The sigma-delta modulator of claim 5, wherein said 1-bit digital output signal is provided to a first multiplexer which multiplies said 1-bit signal by a first coefficient and then provides the product of said multiplication as an input to a third multiplexer.

10. The sigma-delta modulator of claim 9, wherein said output signal from said last register in said first group of serially connected data registers is provided also as another input to said third multiplexer.

11. The sigma-delta modulator of claim 10, wherein an output of said third multiplexer is provided as an input to a third adder.

12. The sigma-delta modulator of claim 5, wherein said first and said second group of serially connected data registers each includes at least three data registers.

13. A method of converting a multi-bit digital input signal to a 1-bit digital output signal, using a digital filter, comprising the steps of:

(a) providing a set of cascaded integration stages;

(b) providing said set of integration stages with a multi-bit digital input signal and a 1-bit digital output signal;

(c) quantizing said 1-bit digital output signal;

(d) multiplying said quantized 1-bit digital output signal by a plurality of filter coefficients selected by a coefficient decode circuit;

(e) providing said multiplied plurality of coefficients to nodes disposed between individual integration stages within said set of integration stages.

14. The method of claim 13, wherein said step of multiplying is accomplished by 1-bit multiplication.

15. A method of converting a multi-bit digital input signal to a 1-bit digital output signal, comprising the steps of:

(a) providing a sigma-delta modulator filter having a multi-bit digital input signal, a 1-bit digital output signal and a plurality of sets of adders, wherein each set of adders calculates a sum of two data terms;

(b) scaling said sum of two data terms calculated by each said set of adders, wherein said scaling is accomplished by one or more shift registers; and (c) adding a third data term to said scaled sum of two data terms for each said set of adders.

16. The method of claim 15, wherein said step of scaling for at least one said set of adders is accomplished by shifting said sum of two data terms.

17. The method of claim 15, further comprising the steps of quantizing said 1-bit digital output signal.

18. The method of claim 17, further comprising the step of multiplying said quantized 1-bit digital output signal by at least one filter coefficient to generate at least one filter product.

19. The method of claim 18, wherein at least one of said data terms being summed in at least one of said sets of adders comprises at least one said filter product.

20. The method of claim 15, further comprising the steps of:

(d) providing at least one additional single adder; and (e) calculating a filter product with said at least one additional single adder by multiplying a feedback filter coefficient by a data feedback term output from an integration stage included in said sigma-delta modulator filter.

21. A method of converting a multi-bit digital input signal to a 1-bit digital output signal, using a digital sigma-delta modulator, comprising the steps of:

(a) inputting said multi-bit digital input signal;

(b) selecting between said input signal and a signal output from a first group of serially connected data registers;

(c) summing said selected signal with a feedback signal;

(d) scaling said added signal;

(e) summing said scaled signal with a first selected signal output from a second group of serially connected data registers;

(f) outputting said sum of said scaled and first selected signals from said sigma-delta modulator as a 1-bit digital output signal.

22. The method of claim 21, further comprising the steps of selecting between a signal output from said second group of serially connected data registers and a signal output from an intermediate register in said second group of data registers, and providing said selected signal as said signal output from said second group of serially connected data registers to be summed with said scaled signal.

23. The method of claim 21, further comprising the step of summing a selected coefficient value with said selected signal and said feedback signal.

24. The method of claim 21, wherein said step of scaling is accomplished by shifting said sum of said selected signal and said feedback signal a minimum of two bit places.

25. A digital sigma-delta modulator filter, comprising:

(a) a plurality of integration stages, including a filter output;

(b) a multi-bit digital input signal input to a first integration stage in said plurality of integration stages;

wherein said filter output is input to a quantizer, said quantizer including an output;

wherein said quantizer output comprises a 1-bit digital output signal; and wherein said 1-bit output signal is multiplied by a filter coefficient, said filter coefficient is selected by a coefficient decode circuit, and then fedback to each of said plurality of integration stages.

* * * * *